(12) United States Patent
Tanner et al.

(10) Patent No.: US 11,044,826 B2
(45) Date of Patent: Jun. 22, 2021

(54) COVER-SECURING MEANS FOR A TRANSMITTER HOUSING

(71) Applicant: Endress+Hauser SE+Co. KG, Maulburg (DE)

(72) Inventors: Jürgen Tanner, Kandern (DE); Raphael Schonhardt, Rheinfelden (DE); Vitogiuseppe Di Cosola, Hartheim (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 182 days.

(21) Appl. No.: 16/472,592

(22) PCT Filed: Dec. 1, 2017

(86) PCT No.: PCT/EP2017/081134
§ 371 (c)(1),
(2) Date: Jun. 21, 2019

(87) PCT Pub. No.: WO2018/114284
PCT Pub. Date: Jun. 28, 2018

(65) Prior Publication Data
US 2019/0357376 A1    Nov. 21, 2019

(30) Foreign Application Priority Data
Dec. 22, 2016   (DE) .................. 20 2016 107 260

(51) Int. Cl.
*H05K 7/14*    (2006.01)
*G01D 11/24*   (2006.01)
(Continued)

(52) U.S. Cl.
CPC ......... *H05K 7/1462* (2013.01); *G01D 11/245* (2013.01); *G01F 15/006* (2013.01); *G01F 15/14* (2013.01); *H05K 5/064* (2013.01)

(58) Field of Classification Search
CPC ..... G01D 11/245; G01F 15/006; G01F 15/14; H05K 5/064; H05K 7/1462
See application file for complete search history.

(56) References Cited

U.S. PATENT DOCUMENTS 4,012,929 A * 3/1977 Solovieff ............ E05B 63/0017
70/134
4,360,041 A * 11/1982 Hagan .................... F16L 45/00
137/247.43

(Continued)

FOREIGN PATENT DOCUMENTS

CN    201705334 U    1/2011
CN    201818621 U    5/2011
(Continued)

*Primary Examiner* — Francis C Gray
(74) *Attorney, Agent, or Firm* — Kelly J. Smith; Endress+Hauser (USA) Holding Inc.

(57) ABSTRACT

The present disclosure relates to a cover-securing mechanism for a transmitter housing closed by a screwed-on cover. The cover-securing mechanism includes a securement pin with a screw arranged at a first end region of the securement pin. A passageway, which is embodied to accommodate the securement pin, is integrated in the cover. A groove includes a circularly shaped section and is introduced into a cover facing region of the transmitter housing. The securement pin is securable at a transmitter housing far end of the cover in the passageway such that in a secured state a second end region of the securement pin protrudes inwardly into the groove and, as such, a twisting of the cover screwed onto the transmitter housing is constrained relative to the transmitter housing.

15 Claims, 1 Drawing Sheet

(51) Int. Cl.
    *G01F 15/00*    (2006.01)
    *G01F 15/14*    (2006.01)
    *H05K 5/06*    (2006.01)

(56) References Cited

U.S. PATENT DOCUMENTS

| | | | | |
|---|---|---|---|---|
| 5,361,925 | A | * | 11/1994 | Wecke .................. F16B 5/10 |
| | | | | 220/325 |
| 6,056,593 | A | * | 5/2000 | Strang ................ H01R 13/506 |
| | | | | 439/536 |
| 6,116,452 | A | * | 9/2000 | Hamel .................. A61L 2/26 |
| | | | | 206/370 |
| 9,217,301 | B1 | * | 12/2015 | Latham ................. E21B 17/16 |
| 2011/0310574 | A1 | | 12/2011 | Nomoto |
| 2012/0063065 | A1 | | 3/2012 | Perrault et al. |

FOREIGN PATENT DOCUMENTS

| | | |
|---|---|---|
| CN | 102191860 A | 9/2011 |
| CN | 202956027 U | 5/2013 |
| CN | 103733031 A | 4/2014 |
| CN | 204855271 U | 12/2015 |
| CN | 105655792 A | 6/2016 |
| DE | 102008001865 A1 | 11/2009 |
| EP | 0910441 A1 | 4/1999 |
| WO | 2006045770 A1 | 5/2006 |

\* cited by examiner

COVER-SECURING MEANS FOR A TRANSMITTER HOUSING

CROSS-REFERENCE TO RELATED APPLICATIONS

The present application is related to and claims the priority benefit of German Patent Application No. 20 2016 107 260.3, filed on Dec. 22, 2016 and International Patent Application No. PCT/EP2017/081134 filed on Dec. 1, 2017, the entire contents of which are incorporated herein by reference.

TECHNICAL FIELD

The invention relates to a cover-securing means for a transmitter housing of a field device of automation technology, wherein the transmitter housing is closed by a screwed-on cover.

BACKGROUND

In automation technology, field devices are applied for determining and/or monitoring process variables. Referred to as field devices in the case of the present invention are, in principle, all measuring devices, which are applied near to the process and which deliver, or process, process relevant information. In such case, of concern are, for example, fill-level measuring devices, flow measuring devices, pressure- and temperature measuring devices, pH-redox potential measuring devices, conductivity measuring devices, etc., which register the corresponding process variables, fill level, flow, pressure, temperature, pH value, and conductivity. Such field devices are manufactured and sold in various forms by the E+H group of companies.

Field devices have, in such case, an electronics unit arranged in a transmitter housing of the field device. The electronics unit serves, for example, for producing an electrical signal representing the process variable, such as, for example, an electrical signal in the form of a voltage and/or an electrical current, and/or for forwarding the produced electrical signal. The transmitter housing is, in such case, closed by a cover. In many cases, the transmitter housing also includes mutually separated connection- and electronics compartments, each of which is closed to the exterior by a cover.

Field devices as above described, which are also to be operated in explosion endangered regions, must satisfy very high safety requirements as regards explosion protection. In such case, of concern, especially, is safely to prevent the forming of sparks or at least to assure that a sparking occurring in the case of malfunction has no effects on the environment. For this, corresponding standards are defined in associated protection classes. In the protection class, "intrinsic safety" (Ex-i), explosion protection is achieved by making the values for electrical variables (electrical current, voltage, power) at all times, in each case, below predetermined limit values, in order that no ignition sparks can be produced in the case of malfunction. In the additional protection class, "increased safety" (Ex-e), explosion protection is achieved by making the spatial distances between two different electrical potentials sufficiently large that spark formation in the case of malfunction cannot occur due to the distance. In the additional protection class, "pressure-resistant encapsulation" (Ex-d), field devices must have a pressure-resistant transmitter housing with a sufficient mechanical strength, i.e. stability.

For the purpose of explosion protection, especially according to the Ex-d protection class, additional mechanical securing means for a cover sealing a transmitter housing are compulsory. Thus, a cover-securing means on the field device prevents unintentional opening of the cover by providing that for opening the cover an additional, cover securing screw must be purposely unscrewed.

The cover-securing means known in the state of the art are embodied, in such case, for example, as a clamp externally mounted on the transmitter housing and closed with a screw. In such case, the transmitter housing is often specially formed to accommodate the clamp and/or screw. Disadvantageous in such solution is that such a clamp, or screw, or both is/are raised above the transmitter housing. For the case, in which the screw of the cover-securing means is exposed, liquid can collect around the screw head and/or the screw thread of the screw, for example, in the presence of high environmental humidity. This acts to corrode the screw head, and the screw thread, and can lead lastly to a failure of the cover-securing means. Furthermore, there can be contact corrosion between the clamp and the transmitter housing. This happens in the case of damage of the lacquer layer on the cover and on the transmitter housing.

SUMMARY

An object of the invention is to provide a corrosion resistant cover-securing means for a transmitter housing of a field device of automation technology.

The invention is achieved by a cover-securing means for a transmitter housing of a field device of automation technology, wherein the transmitter housing is closed by a screwed-on cover, comprising:

a securement pin with a screw arranged at a first end region of the securement pin, integrated in the cover, a passageway, which is embodied to accommodate the securement pin; and a groove, which comprises a circularly shaped section and which is introduced into a cover-facing region of the transmitter housing;

wherein the securement pin is securable at a transmitter housing far end of the cover in such a manner in the passageway that in the secured state a second end region of the securement pin opposite the first end region protrudes inwardly into the groove, whereby a twisting of the cover screwed onto the transmitter housing is constrained relative to the transmitter housing.

According to the invention, the securement pin and its screw are accommodated in the passageway in the cover, so that especially the screw is protected as much as possible against corrosion. A further advantage of the invention provides that a transmitter housing without such a cover-securing means can, by means of very simple, subsequent processing of the transmitter housing and cover, be retrofitted to a transmitter housing having a cover-securing means, without necessitating a specially formed transmitter housing. For this, only the passageway in the cover and the groove in the transmitter housing must be subsequently introduced. A transmitter housing can thus be manufactured based on the same, essentially equally formed, starting housing with or without cover-securing means. In this way, a high degree of modularization is achieved in the housing manufacture, whereby, in turn, manufacturing costs are lowered.

In an embodiment of the invention, the cover and the transmitter housing are cylindrical, at least in certain regions, wherein the cover is screwed with its cylindrical region onto the cylindrical region of the transmitter housing.

In an embodiment of the invention, the circularly shaped section extends around an imaginary circle center of the cylindrical region of the transmitter housing in such a manner that the securement pin screwed into the passageway in the inserted state constrains twisting of the screwed-on cover relative to the transmitter housing to a circularly shaped section having a segment angle (α), which matches the circularly shaped section around the imaginary center, wherein the segment angle (α) is less than 120°.

In an additional embodiment of the invention, the segment angle (α) amounts to between 30° and 90°. Especially, the segment angle (α) amounts to between 50° and 70°. Preferably, the segment angle (α) amounts to 60°.

In an embodiment, the securement pin is formed of a ductile material. Ductility refers to the property of a material, in the case of which it first deforms plastically under load, before it breaks.

In an embodiment of the invention, the securement pin is formed of a metal or a metal alloy. Especially, the securement pin is formed of a steel. Preferably, in such case, the steel is a hardened steel.

In an embodiment, the screw enables the securement pin to be screwed into place.

In a preferred further development of the invention, the groove is adapted in such a manner to the embodiment of the securement pin that between the second end region of the securement pin inserted into the passageway and a bottom of the groove a gap is formed, especially a gap determined by a depth of the groove. In this preferred embodiment, consequently, the securement pin does not contact the groove bottom. In this way, it is e.g. advantageously prevented that a lacquer applied, for example, on the metal transmitter housing (for the corrosion protection of the transmitter housing) gets damaged by the securement pin, for instance, by abrasion of the lacquer by the second end region of the securement pin.

In an embodiment of the invention, the first end region of the securement pin inserted into the passageway extends in a transmitter housing far direction at most to the transmitter housing far end of the cover. In this way, the first end region does not protrude outwardly from the cover, and is thereby especially protected from environmental conditions, such as, for example, high moisture and corrosion caused thereby.

In an advantageous, further development of this embodiment, the screw of the securement pin inserted into the passageway is sunk by at least 2 mm from the transmitter housing far end of the cover.

In an embodiment of the invention, the passageway is drilled in the cover.

In an embodiment of the invention, the groove in the transmitter housing is drilled or milled.

In an advantageous, further development of the invention, a sealing element sealing the passageway is arranged between the transmitter housing and the securement pin.

In an embodiment of this further development, the sealing element is an O-ring surrounding the securement pin at its first end region.

In an embodiment, the sealing element is composed of a synthetic material. Especially, the sealing element is composed of an elastomer.

BRIEF DESCRIPTION OF THE DRAWING

The invention will now be explained in greater detail based on the appended drawing. Equal reference characters refer to equal features; when perspicuity requires or it otherwise appears sensible, already presented reference characters are omitted in subsequent figures. The figures of the drawing show as follows:

FIG. 3b shows a sectional view of the embodiment of the cover-securing means of the invention shown in FIG. 3a.

DETAILED DESCRIPTION

Figure 1:
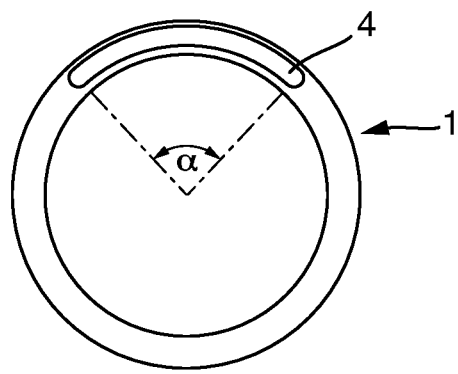
FIG. 1 shows a plan view of a transmitter housing with a groove in an embodiment of the cover-securing means of the invention.

FIG. 1 shows a plan view of the region of the transmitter housing 1 facing the cover 2 in an embodiment of the cover-securing means of the invention. Shown is the groove 4, which is introduced into a wall of the transmitter housing 1 facing the cover 2. Groove 4 comprises a circularly shaped section of segment angle α about an imaginary circle center of the transmitter housing 1. The securement pin 3 (not shown) screwed into the passageway 21 in the inserted state limits twisting of the screwed-on cover 2 (not shown) to the segment angle α relative to the transmitter housing 1.

Figure 2:
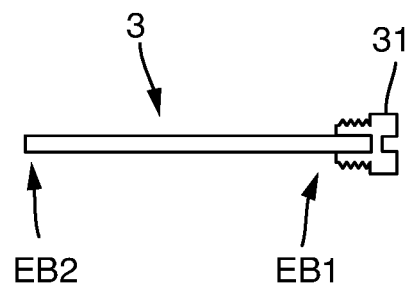
FIG. 2 shows a sectional view of a securement pin in an embodiment of the cover-securing means of the invention.

FIG. 2 shows a sectional view of the securement pin 3. The securement pin 3 is manufactured as one piece or alternatively by means of material bonding, for example, welding, of a prefabricated pin and a prefabricated screw 31. Securement pin 3 includes a first end region ER1, where the screw 31 is arranged, as well as a second end region ER2, which lies opposite the first end region ER1. The second end region ER2 of the securement pin 3 protrudes in the inserted state into the groove 4.

Figure 3A:
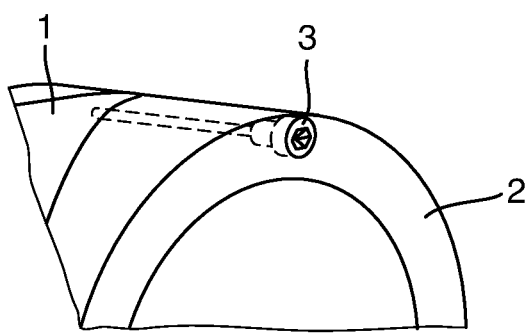
FIG. 3a shows a perspective view of an embodiment of the cover-securing means of the invention.

Such can be seen in FIG. 3a, which is a perspective view of an embodiment of the cover-securing means of the invention. Securement pin 3 is here screwed into the passageway 21, which extends in the cover 2. In this regard, passageway 21 includes at an end region far from the transmitter housing 1 a screw thread, into which the screw 31 of the securement pin 3 is screwed in.

The screwed in securement pin 3 limits twisting of the cover 2 relative to the transmitter housing 1 to a segment angle α (compare FIG. 1), which in this example of an embodiment amounts to 60°. This twisting of the cover 2, relative to the transmitter housing 1 is not sufficient for an unscrewing of the cover 2. The segment angle α enables a certain variation of the angular position of the securement pin 3 in the groove 4, this being necessary, for example, as a result of tolerances in the manufacturing.

In order to be able to screw the cover 2 completely off, first, such as required in the Ex-d protection class, screw 31 must be unscrewed and the securement pin shifted in the direction in the cover 2 away from the transmitter housing 1. Thus, the screwed-in securement pin 3 secures the cover 2 screwed onto the transmitter housing 1.

Figure 3B:
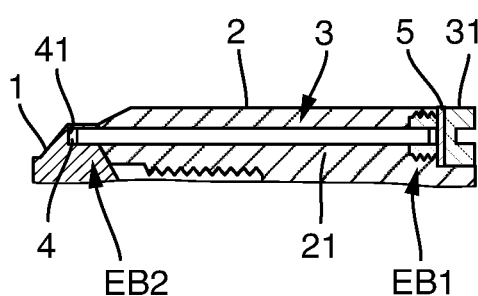

The securement pin 3 of FIG. 3a inserted into the passageway 21 is shown in greater detail in the sectional view of FIG. 3b. In such case, the gap between the second end region ER2 of the securement pin 3 and the groove bottom 41 of the groove 4 can be seen. In this way, the securement pin 3 does not in the state inserted into the passageway 21 contact the groove bottom 41 of the groove 4, whereby the risk of damage of the lacquer, with which the transmitter housing 1 is coated, is reduced. Such is important, since this lacquer serves, among other things, as a corrosion protection layer for the transmitter housing. Only in the case of an attempt to unscrew the cover 2 secured by the cover-securing means does the securement pin 3 hit laterally on the end regions of the groove 4. In this way, further twisting of the cover relative to the transmitter housing 1 beyond the segment angle α (compare FIG. 1) is prevented. In this way, an unscrewing of the cover 2 secured with the cover-securing means of the invention is excluded.

In this embodiment, a sealing element 5 is supplementally provided. Sealing element 5 is an O-ring of an elastomer. Sealing element 5 is located preferably at the first end region ER1 between the screw 31 and the transmitter housing 1. In this way, the passageway 21 is supplementally sealed against incursion of moisture.

A further advantage of the cover-securing means of the invention provides that the securement pin 3 in the unscrewed state does not have to be completely removed from the passageway 21. After unscrewing, the securement pin 3 only needs to be shifted in the direction toward the transmitter housing 1 far end of the cover 2 sufficiently far that the second end region ER2 of the securement pin 3 no longer engages in the groove 4. This shifting of the unscrewed cover-securing means enables the unscrewing of the cover 3. Since the securement pin 3 is only shifted, the probability of the securement pin 3 falling out is significantly reduced. Such a falling out could otherwise lead to a complete loss of the securement pin 3 and therewith the cover-securing means, for example, in the case, in which the field device is operated in difficultly accessible areas.

Figure 4:
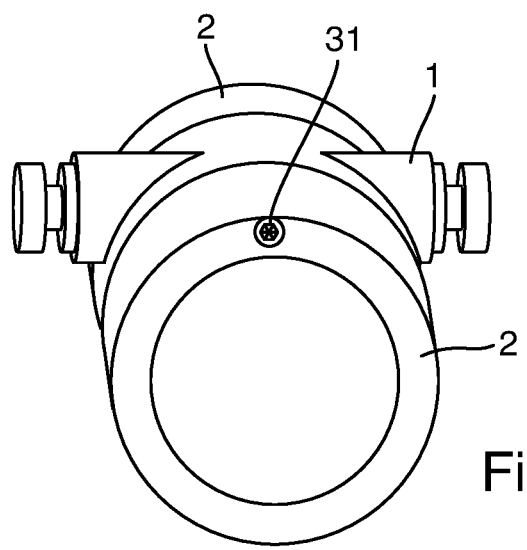
FIG. 4 shows a perspective view of an embodiment of the cover-securing means of the invention.

FIG. 4 shows a perspective view of a transmitter housing 1 of a field device having two cover-securing means of the invention for two covers 2 closing the transmitter housing 1 at two different end regions. Visible in the view is only the screw head of the screw 31 of the securement pin 3, which secures a first of the two covers 2. The screw head of the securement pin is sunk by a small offset of 3 mm from the transmitter housing 1 far end of the cover 2 in the direction of the transmitter housing 1. The screw head of the screw 31 of the securement pin 3 can, in such case, (independently of the embodiment shown here) supplementally be coated with an additional corrosion protection layer, for example, of gold.

REFERENCE CHARACTERS AND SYMBOLS 1 transmitter housing
2 cover
21 passageway
3 securement pin
31 screw
4 groove
41 groove bottom
5 sealing element
ER1 first end region
ER2 second end region
α segment angle

The invention claimed is:

1. A cover-securing mechanism for a transmitter housing of a field device of automation technology, wherein the transmitter housing is closed by a screwed-on cover, including:

a securement pin with a screw arranged at a first end region of the securement pin;

a passageway, which is embodied to accommodate the securement pin, integrated in the cover; and a groove, which includes a circularly shaped section and which is introduced into a cover facing region of the transmitter housing;

wherein the securement pin is securable at a transmitter housing far end of the cover in the passageway such that in a secured state a second end region of the securement pin opposite the first end region protrudes inwardly into the groove, whereby a twisting of the cover screwed onto the transmitter housing is constrained relative to the transmitter housing.

2. The cover-securing mechanism of claim 1, wherein the cover and the transmitter housing are cylindrical and the cover is screwed with a cylindrical region onto a cylindrical region of the transmitter housing.

3. The cover-securing mechanism of claim 2, wherein the circularly shaped section extends around an imaginary circle center of the cylindrical region of the transmitter housing such that the securement pin screwed into the passageway in the secured state constrains twisting of the screwed-on cover relative to the transmitter housing to a circularly shaped section having a segment angle, which matches the circularly shaped section around the imaginary circle center, wherein the segment angle is less than 120°.

4. The cover-securing mechanism of claim 3, wherein the segment angle is between 30° and 90°.

5. The cover-securing mechanism of claim 1, wherein the securement pin is formed of a ductile material.

6. The cover-securing mechanism of claim 1, wherein the securement pin is formed of a metal or a metal alloy.

7. The cover-securing mechanism of claim 1, wherein the screw enables the securement pin to be screwed into the passageway.

8. The cover-securing mechanism of claim 1, wherein the groove is adapted in such a manner to the securement pin that between the second end region of the securement pin inserted into the passageway and a groove bottom of the groove a gap is formed.

9. The cover-securing mechanism of claim 1, wherein the first end region of the securement pin inserted into the passageway extends in a transmitter housing far direction toward a transmitter housing far end of the cover.

10. The cover-securing mechanism of claim 9, wherein the screw of the securement pin inserted into the passageway is sunk by an offset of at least 2 mm from the transmitter housing far end of the cover.

11. The cover-securing mechanism of claim 1, wherein the passageway is drilled in the cover.

12. The cover-securing mechanism of claim 1, wherein the groove is drilled or milled in the transmitter housing.

13. The cover-securing mechanism of claim 1, wherein a sealing element sealing the passageway is positioned between the transmitter housing and the securement pin.

14. The cover-securing mechanism of claim 13, wherein the sealing element is an O-ring surrounding the securement pin at its first end region.

15. The cover-securing mechanism of claim 13, wherein the sealing element includes a synthetic material.

\* \* \* \* \*